US010418296B2

(12) United States Patent
Wang et al.

(10) Patent No.: US 10,418,296 B2
(45) Date of Patent: Sep. 17, 2019

(54) SEMICONDUCTOR CHIP PACKAGE STRUCTURE AND PACKAGING METHOD THEREFOR

(71) Applicant: China Wafer Level CSP Co., Ltd., Suzhou, Jiangsu (CN)

(72) Inventors: Zhiqi Wang, Suzhou (CN); Xianglong Liu, Suzhou (CN); Yuanhao Xu, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/748,647

(22) PCT Filed: Aug. 16, 2016

(86) PCT No.: PCT/CN2016/095416
§ 371 (c)(1),
(2) Date: Jan. 29, 2018

(87) PCT Pub. No.: WO2017/028778
PCT Pub. Date: Feb. 23, 2017

(65) Prior Publication Data
US 2019/0006253 A1  Jan. 3, 2019

(30) Foreign Application Priority Data

Aug. 18, 2015 (CN) .......................... 2015 1 0505195
Aug. 18, 2015 (CN) ..................... 2015 2 0620396 U

(51) Int. Cl.
*H01L 23/24* (2006.01)
*H01L 27/146* (2006.01)

(52) U.S. Cl.
CPC ........ *H01L 23/24* (2013.01); *H01L 27/14618* (2013.01); *H01L 27/14687* (2013.01)

(58) Field of Classification Search
None
See application file for complete search history.

(56) References Cited

U.S. PATENT DOCUMENTS 5,201,960 A * 4/1993 Starov ............... H01L 21/67023
134/11
2004/0036069 A1  2/2004 Barton et al.
(Continued)

FOREIGN PATENT DOCUMENTS

CN          1685500 A      10/2005
CN        101414613 A       4/2009
(Continued)

OTHER PUBLICATIONS

International Search Report for Application No. PCT/CN2016/095416 dated Nov. 21, 2016.
(Continued)

*Primary Examiner* — Anthony Ho
*Assistant Examiner* — Kevin Quinto
(74) *Attorney, Agent, or Firm* — Wolf, Greenfield & Sacks, P.C.

(57) ABSTRACT

A semiconductor chip package and a semiconductor chip packaging method are provided. The package includes: a semiconductor chip having a functional region, a protective substrate located on one side of the semiconductor chip and covering the functional region, and a support unit located between the protective substrate and the semiconductor chip and enclosing the functional region. The support unit includes an outer support member and an inner support member located inside the outer support member. A receiving cavity is formed between the inner support member, the semiconductor chip and the protective substrate. A hollow cavity is formed between the inner support member, the outer support member, the semiconductor chip and the protective substrate. The inner support member is provided
(Continued)

with at least one first ventilating structure, through which the receiving cavity is in communication with the hollow cavity.

18 Claims, 4 Drawing Sheets

(56) References Cited

U.S. PATENT DOCUMENTS

| | | |
|---|---|---|
| 2004/0061127 A1 | 4/2004 | Fan |
| 2008/0216890 A1* | 9/2008 | Lim .................. H01L 31/02246 136/252 |
| 2009/0102005 A1 | 4/2009 | Weng et al. |
| 2010/0117181 A1 | 5/2010 | Kim et al. |
| 2012/0112329 A1* | 5/2012 | Yen ..................... H01L 23/3171 257/666 |
| 2014/0008753 A1 | 1/2014 | Tsuduki et al. |

FOREIGN PATENT DOCUMENTS

| | | |
|---|---|---|
| CN | 102651350 A | 8/2012 |
| CN | 102782862 A | 11/2012 |
| CN | 103400807 A | 11/2013 |
| CN | 103531488 A | 1/2014 |
| CN | 104022046 A | 9/2014 |
| CN | 104637967 A | 5/2015 |
| CN | 105185751 A | 12/2015 |
| CN | 204991681 U | 1/2016 |
| JP | 2004119881 A | 4/2004 |
| JP | 2005-322809 A | 11/2005 |
| JP | 2008-047889 A | 2/2008 |
| JP | 2014-030155 A | 2/2014 |
| JP | 2014-241446 A | 12/2014 |
| TW | 201236117 A1 | 9/2012 |

OTHER PUBLICATIONS

Written Opinion for Application No. PCT/CN2016/095416 dated Nov. 21, 2016.
First Office Action for Chinese Application No. 201510505195.X, dated Jun. 23, 2017.
First Office Action for Japanese Application No. 2018-506576, dated Dec. 17, 2018.
First Office Action for Taiwanese Application No. 105126082, dated Jun. 21, 2017.

* cited by examiner

SEMICONDUCTOR CHIP PACKAGE STRUCTURE AND PACKAGING METHOD THEREFOR

This application is the National Stage application of PCT international patent application PCT/CN2016/095416, filed on Aug. 16, 2016 which claims priority to Chinese Patent Application No. 201510505195.X, titled "SEMICONDUCTOR CHIP PACKAGE STRUCTURE AND PACKAGING METHOD THEREFOR" and filed with the Chinese State Intellectual Property Office on Aug. 18, 2015, and priority to Chinese Patent Application No. 201520620396.X, titled "SEMICONDUCTOR CHIP PACKAGE STRUCTURE" and filed with the Chinese State Intellectual Property Office on Aug. 18, 2015, all of which applications are incorporated herein by reference in their entireties.

FIELD

The present disclosure relates to the technical field of a semiconductor, and particularly to a semiconductor chip package and a packaging method for a semiconductor chip.

BACKGROUND

Semiconductor chips need to be packaged, and the semiconductor chips may be protected with packaging technology, thereby preventing the semiconductor chips from being polluted by an external environment. In addition, circuit interfaces in the semiconductor chips may also be leaded out with the packaging technology, thereby facilitating connection between the semiconductor chips and other circuits.

The existing mainstream packaging technology is wafer level chip size packaging (WLCSP) technology, in which, a whole wafer is packaged and tested, and then the wafer is cut to obtain a single finished chip. A size of the single finished chip packaged with the packaging technology is the same as that of a single die, which meets market requirements of being lighter, smaller, shorter, thinner and cheaper for microelectronic products. The wafer level chip size packaging technology is a hot topic and a future development trend in the current packaging field.

Reference is made to FIG. 1, which shows a wafer 1'. The wafer 1' is a wafer level semiconductor chip with a size such as 8 inches, 12 inches or other size, and the size of the wafer 1' is not limited herein. Multiple dies 11' are arranged in an array on the wafer 1', and the dies 11' are semiconductor chips having image sensors. Reference is made to FIG. 2, which is a schematic diagram of a structure obtained after a protective substrate 2' is aligned and laminated with the wafer 1'. A shape and a size of the protective substrate 2' are the same as those of the wafer 1'. In the embodiment, the protective substrate 2' is optical glass with high transmittance, and multiple support units are arranged in an array on the protective substrate 2'. The wafer 1' and the protective substrate 2' are aligned and laminated by coating adhesive on the top of the support units. The support units are arranged between the wafer 1' and the protective substrate 2', to form a certain gap between the wafer 1' and the protective substrate 2'. Each of the support units corresponds to one die 11'. The die 11' has a functional region 111', which is enclosed by the support unit. In general, the support unit has a double-layer structure or a multi-layer structure, thereby isolating and protecting the functional region 111', forming a gap between the wafer 1' and the protective substrate 2' and providing an enough support force. The support unit includes an inner support member 211' and an outer support member 212'. In a case that the wafer 1' and the protective substrate 2' are laminated together, a closed accommodating cavity 213' is formed among the inner support member 211', the wafer 1' and the protective substrate 2'.

SUMMARY

A semiconductor chip package is provided according to an embodiment of the present disclosure, thereby solving a problem of cracking of a support unit, and improving the reliability of the semiconductor chip package.

A semiconductor chip package is provided according to an embodiment of the present disclosure, which includes: a semiconductor chip having a functional region; a protective substrate arranged on one side of the semiconductor chip and covering the functional region; and a support unit arranged between the protective substrate and the semiconductor chip and enclosing the functional region, where the support unit includes an outer support member and an inner support member arranged inside the outer support member, an accommodating cavity is formed among the inner support member, the semiconductor chip and the protective substrate, a hollow cavity is formed among the inner support member, the outer support member, the semiconductor chip and the protective substrate, and the inner support member is provided with at least one first ventilating structure, through which the accommodating cavity is in communication with the hollow cavity.

In the present disclosure, the ventilating structure is arranged on the inner support member, thereby effectively releasing pressure generated by instantaneous gasification and expansion of vapor and solving a problem of cracking of the support unit.

Optionally, the outer support member may be provided with at least one second ventilating structure, through which the hollow cavity may be in communication with outside of the outer support member, and the first ventilating structure and the second ventilating structure may be staggered from each other.

Optionally, an airflow passage may be formed in the hollow cavity, and a distance between the first ventilating structure and the second ventilating structure may be no less than a half of a length of the airflow passage.

Optionally, the inner support member may be provided with at least two first ventilating structures, and a line between the two first ventilating structures may be located at an edge of the functional region.

Optionally, the hollow cavity may be provided with a blocking member for blocking airflow, and the first ventilating structure and the second ventilating structure may be respectively arranged at two sides of the blocking member.

Optionally, the inner support member, the outer support member and the blocking member may be made of photoresist.

Optionally, the first ventilating structure may be an opening or a through hole, the second ventilating structure may be an opening or a through hole, a height of the opening may be equal to a height of the inner support member, and a height of the through hole may be less than the height of the inner support member.

Optionally, the semiconductor chip may be an image sensor chip.

Optionally, the semiconductor chip may have a first surface and a second surface opposite to the first surface. The semiconductor chip may further include: contact pads electrically connected to the functional region; through holes penetrating the semiconductor chip from the second surface of the semiconductor chip, where the contact pads are exposed through the through holes; an insulating layer covering the second surface of the semiconductor chip and sidewall surfaces of the through holes; a metal layer arranged on a surface of the insulating layer and electrically connected to the contact pads; a solder mask arranged on a surface of the metal layer and the surface of the insulating layer, where the solder mask includes openings through which a part of the metal layer is exposed; and external projections filling the openings and exposed outside a surface of the solder mask.

A packaging method for the semiconductor chip is provided according to an embodiment of the present disclosure, which includes: providing a wafer to be packaged, where multiple semiconductor chips are arranged in an array on the wafer, and each of the multiple semiconductor chips has a functional region; providing a protective substrate, and forming multiple support units arranged in an array on the protective substrate, where each of the multiple support units corresponds to one of the semiconductor chips; aligning and laminating the protective substrate with the wafer, to bond the protective substrate and the wafer together, where the support units are arranged between the protective substrate and the wafer, each of the support units includes an outer support member and an inner support member arranged inside the outer support member, an accommodating cavity is formed among the inner support member, the semiconductor chip and the protective substrate, a hollow cavity is formed among the inner support member, the outer support member, the semiconductor chip and the protective substrate, and the inner support member is provided with at least one first ventilating structure, through which the accommodating cavity is in communication with the hollow cavity.

Optionally, the forming the support units on the protective substrate may include: forming a photoresist film on one of surfaces of the protective substrate; performing pattern exposure on the photoresist film by using a patterned mask; developing to form photoresist patterns on the protective substrate; and performing bake hardening on the photoresist patterns to form the support units.

Optionally, the forming the support units on the protective substrate may include: forming photoresist patterns on one of surfaces of the protective substrate by screen printing; exposing and developing the photoresist patterns; and performing bake hardening on the photoresist patterns to form the support units.

Optionally, the forming the support units on the protective substrate may include: forming a material layer on one of surfaces of the protective substrate; and patterning the material layer to remove a part of the material layer and form the support units.

DETAILED DESCRIPTION OF EMBODIMENTS

The present disclosure is described in detail hereinafter in conjunction with the embodiments shown in drawings. The embodiments are not intended to limit the present disclosure, and various changes made onto structures, methods or functions by those skilled in the art according to the embodiments are included within the protection scope of the present disclosure.

Figure 1:
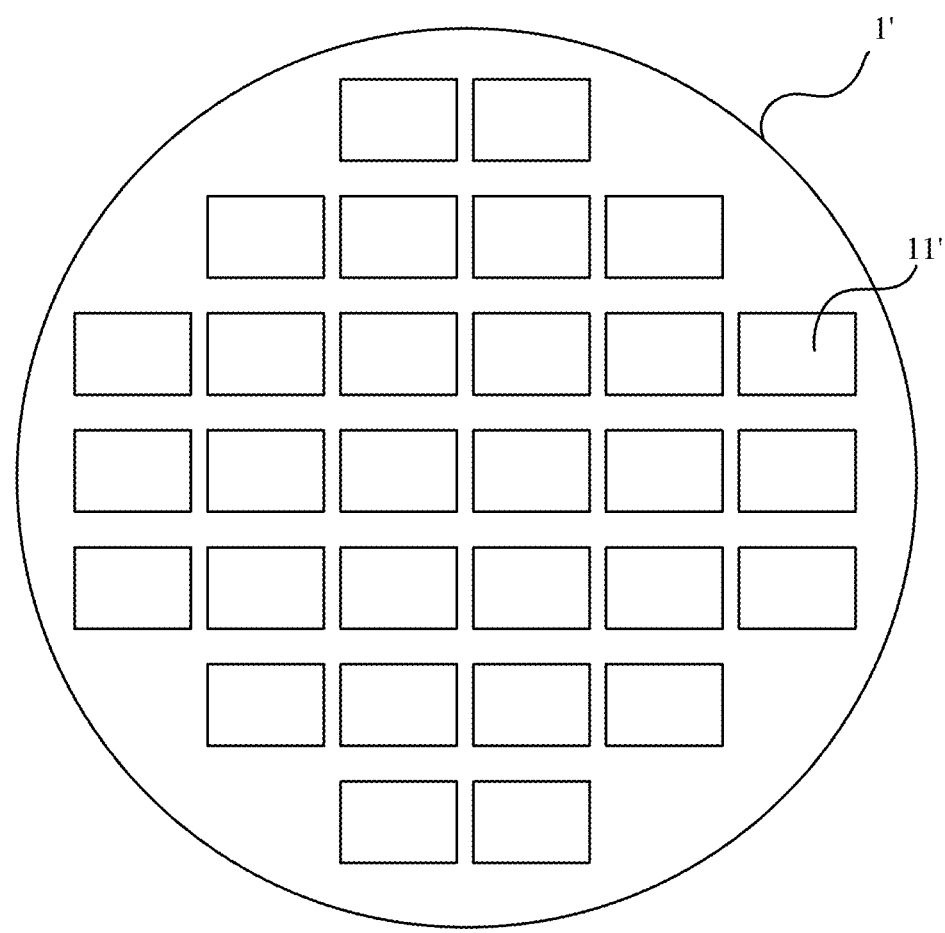
FIG. 1 is a schematic structural diagram of a wafer according to the conventional technology.
Figure 2:
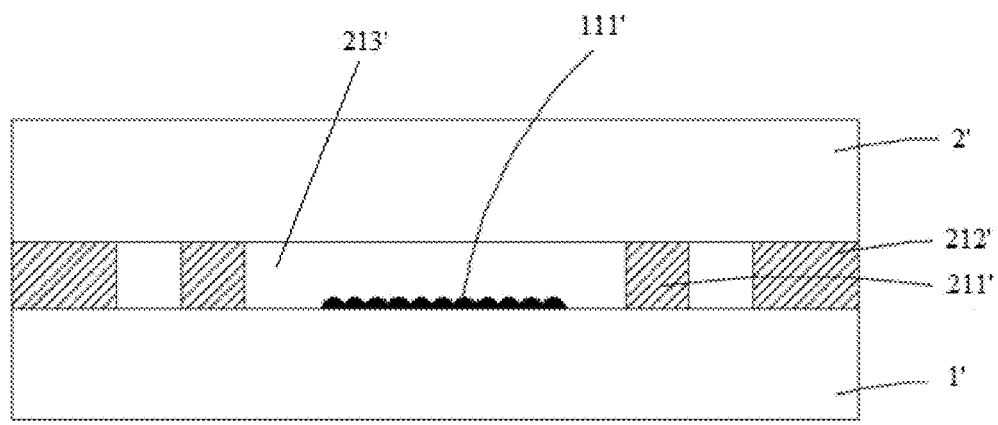
FIG. 2 is a sectional view obtained after a protective substrate is aligned and laminated with a wafer according to the conventional technology.
Figure 3:
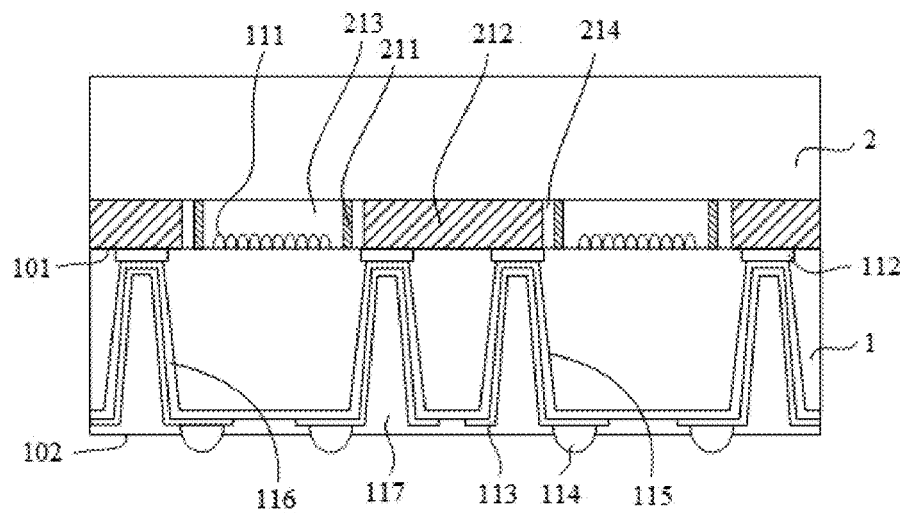
FIG. 3 is a sectional view obtained after a protective substrate is aligned and laminated with a wafer according to an embodiment of the present disclosure.

Referring to FIG. 3, a wafer 1 has multiple dies arranged in an array, multiple support units are arranged in an array on a protective substrate 2, and the wafer 1 is aligned and laminated with the protective substrate 2. The support units are arranged between the wafer 1 and the protective substrate 2, to form a gap between the wafer 1 and the protective substrate 2, and each of the support units corresponds to one die.

The wafer 1 has a first surface 101 and a second surface 102 opposite to the first surface 101. The die is a semiconductor chip. Optionally, in an embodiment of the present disclosure, the die may be a semiconductor chip having an image sensor. A functional region 111 and contact pads 112 electrically connected to the functional region 111 are arranged on one side of the die. The functional region 111 and the contact pads 112 are arranged on the first surface 101 of the wafer 1. The image sensor is arranged in the functional region 111, to receive external light and convert the external light into electrical signals. A through hole 115 penetrating the wafer 1 is formed at a position corresponding to the contact pad 112. An electrical connection pad is arranged on the second surface 102 of the wafer 1. In an embodiment of the present disclosure, the electrical connection pad may be a solder ball 114. A wiring layer 113 is arranged between the solder ball 114 and the contact pad 112 to electrically connect the solder ball 114 with the contact pad 112. The electrical signals are transmitted to a PCB electrically connected to the chip or other circuits on an FPC electrically connected to the chip via the contact pad 112, the wiring layer 113 and the solder ball 114.

The protective substrate 2 is arranged on one side of the dies and covers the functional regions 111. The support unit encloses the functional region 111 around the functional region 111. The support unit includes an outer support member 212 and an inner support member 211 arranged inside the outer support member 212. After the wafer 1 is aligned and laminated with the protective substrate 2, an accommodating cavity 213 is formed among the inner support member 211, the wafer 1 and the protective substrate 2, and a hollow cavity 214 is formed among the inner support member 211, the outer support member 212, the wafer 1 and the protective substrate 2.

After the wafer 1 is packaged and cut into multiple finished semiconductor chips, a series of reliability tests are performed on the finished semiconductor chip. The reliability tests include a moisture absorption test and a high temperature test. For example, after the packaged finished semiconductor chip is placed in a high-humidity environment for a time period, and then is placed in a high-temperature environment for a time period, and various parameters of the chip are checked. The tests are not described in detail here.

It is observed that in the reliability tests, the support unit may crack, which affects a quality of the finished chip. The reason causing the cracking of the support unit is that the support unit of the finished semiconductor chip in the conventional technology has a sealing structure, in which, vapor in the finished semiconductor chip is instantaneously gasified and expands in a sudden high temperature environment, and the support unit is impacted to crack. In particular, in a case that the support unit is provided with multi-layer support members, cracking mainly occurs in the support member in the innermost layer if the support member in the innermost layer is sealed.

With the support unit provided according to the embodiment of the present disclosure, the problem of the cracking of the support member can be solved.

In an embodiment of the present disclosure, the inner support member may be provided with at least one first ventilating structure, through which the accommodating cavity is in communication with the hollow cavity, thereby releasing pressure on a support structure generated by instantaneous gasification and expansion of vapor in the finished semiconductor chip. In an embodiment of the present disclosure, the first ventilating structure may be an opening.

Figure 4:
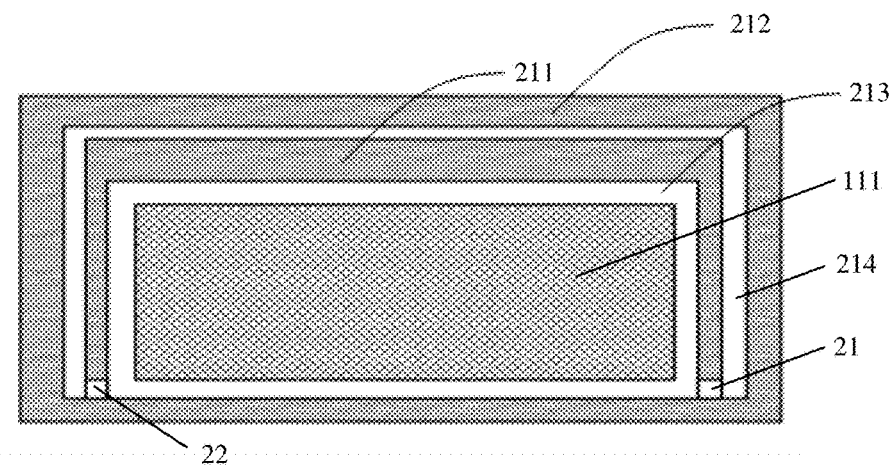
FIG. 4 is a schematic top view of a single finished chip according to an embodiment of the present disclosure.

Referring to FIG. 4, the functional region 111 is quadrilateral, the inner support member 211 is II-shaped, and the outer support member 212 is quadrilateral. The inner support member 211 is provided with an opening 21 and an opening 22, through which the accommodating cavity 213 is in communication with the hollow cavity 214, and the pressure generated by the expansion of the vapor is effectively released, thereby preventing the cracking of the support unit. The width of the opening 21 or the width of the opening 22 is the same as the width of a corresponding side of the inner support member 211, and the length of the opening 21 or the length of the opening 22 is not greater than one fifth of the length of the corresponding side of the inner support member 211. In this way, air pressure can be released effectively, while a support force provided by the inner support member provided with the opening differs a little from a support force provided by the inner support member without the opening.

The opening 21 and the opening 22 are arranged on two opposite sides of the inner support member 211, and a line between the opening 21 and the opening 22 is parallel to the other side of the inner support member 211. Optionally, in an embodiment of the present disclosure, each of the opening 21 and the opening 22 is provided at an end of a side where the opening is provided, and the line between the opening 21 and the opening 22 is located at an edge of the functional region 111, in this way, the inner support member 211 can provide an enough support force for the functional region 111. The line between the two openings is located at the edge of the functional region 111 rather than passing through the functional region 111, in this way, the inner support member 211 can effectively protect the functional region 111, to prevent the semiconductor chip from cracking along the line between the two openings under the action of an external force, and the inner support member 211 with such structure can provide a uniform support force for the functional region 111.

Figure 5:
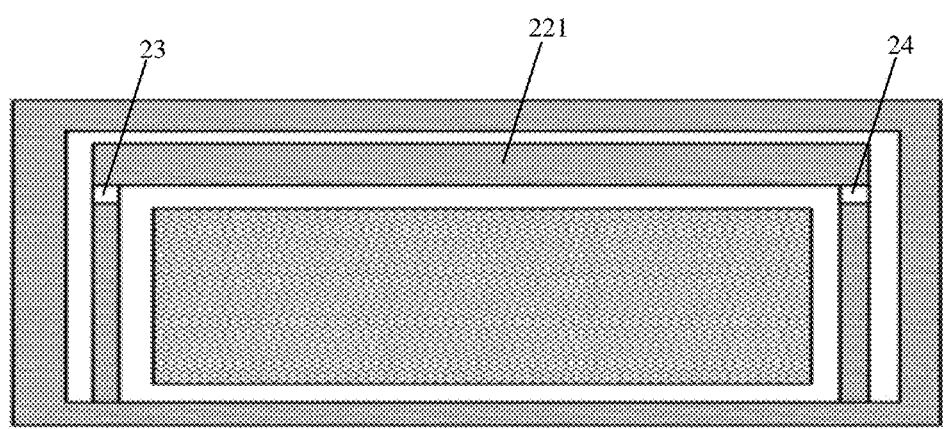
FIG. 5 is schematic top view of a single finished chip according to another embodiment of the present disclosure.

Referring to FIG. 5, a structure of the inner support member 221 in FIG. 5 is similar to that of the inner support member 211 in FIG. 4, except that positions of an opening 23 and an opening 24 in FIG. 5 are different from those of the opening 21 and the opening 22 in FIG. 4.

In practice, a shape of the inner support member 211 is not limited in the embodiment of the present disclosure. For example, the inner support member 221 may be II-shaped or quadrilateral, and whether the line between the two openings is parallel to the other side of the II-shaped inner support member is not limited in the embodiment of the present disclosure, as long as the line between the two openings does not pass through the functional region, that is, the line between the two openings is located at the edge of the functional region. In an embodiment of the present disclosure, the line may be inclined at a certain angle with respect to the other side of the II-shaped inner support member.

Figure 6:
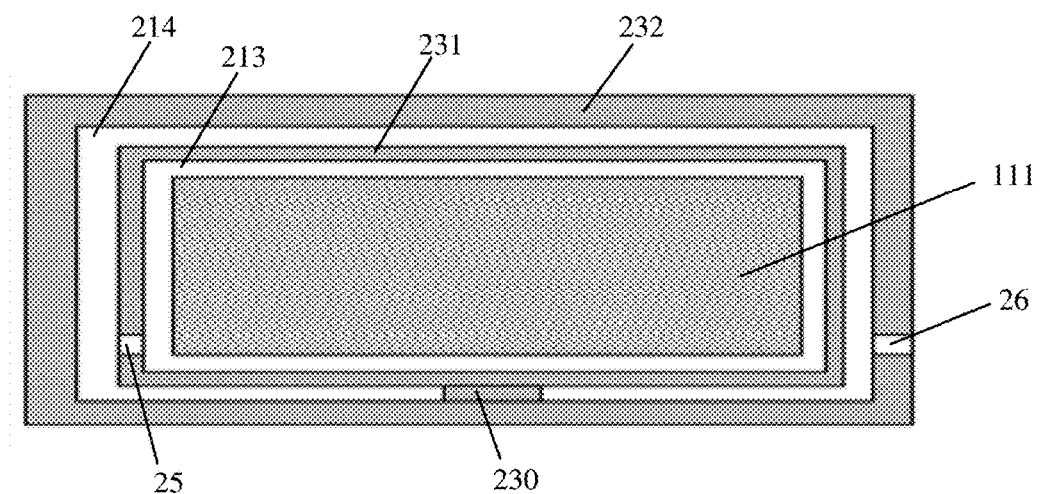
FIG. 6 is schematic top view of a single finished chip according to another embodiment of the present disclosure.

Referring to FIG. 6, the functional region 111 is quadrilateral, the inner support member 231 is quadrilateral, and the outer support member 232 is quadrilateral. The inner support member 231 is provided with an opening 25, through which the accommodating cavity 213 is in communication with the hollow cavity 214, and pressure generated by expansion of the vapor in the accommodating cavity 213 is effectively released. The outer support member 232 is provided with an opening 26, through which the hollow cavity 214 is in communication with outside of the outer support member 232, and air pressure in the hollow cavity 214 is effectively released. The ventilating structures are arranged on both the inner support member 231 and the outer support member 232, thereby effectively solving a problem that the air pressure in the accommodating cavity 213 cannot be effectively released in a case that the high temperature vapor is blocked by the sealed outer support member and returns back to the inside of the accommodating cavity 231.

A distance between the opening 25 and the opening 26 is greater than a distance between the inner support member 231 and the outer support member 232, that is, a position of the opening 25 is staggered from a position of the opening 26, thereby preventing particles such as dust from entering the functional region 111 through the opening 25 and the opening 26.

An airflow passage is formed in the hollow cavity 214, and the particles such as dust can be prevented from entering the functional region 111 by increasing the distance between the opening 26 and the opening 25. Optionally, the distance between the opening 26 and the opening 25 is set to be one second of the length of the airflow passage formed in the hollow cavity 214.

In the embodiment, a blocking member 230 for blocking airflow is provided between the inner support member 231 and the outer support member 232, and the particles such as dust can be prevented from entering the inside of the accommodating cavity 213 by reasonably arranging the opening 26, the opening 25, and the blocking member 230. In FIG. 6, the opening 26 and the opening 25 divide the passage formed in the hollow cavity 214 into a first passage and a second passage, the length of the first passage is less than that of the second passage, and the blocking member 230 is provided on the first passage, so that the opening 25 and the opening 26 are located at two sides of the blocking member 230 respectively.

An effect of preventing the particles such as dust from entering the accommodating cavity 213 gets better with the increase of a difference between the length of the first passage and the length of the second passage.

In a case that both the inner support member and the outer support member are quadrilateral, and no blocking member is provided, the longest distance between the opening arranged on the inner support member and the opening arranged on the outer support member is one second of the length of the passage formed in the hollow cavity. In a case that the inner support member is Π-shaped and the outer support member is quadrilateral, the longest distance between the opening arranged on the inner support member and the opening arranged on the outer support member is approximately equal to the length of the passage formed in the hollow cavity.

In an embodiment of the present disclosure, the inner support member, the outer support member and the blocking member may be made of photoresist. A process for forming the support unit includes: 1) forming a photoresist film on one of surfaces of the protective substrate 2 by means of spin coating or spraying; 2) performing pattern exposure on the photoresist film by using a patterned mask; 3) developing to form a photoresist pattern on the protective substrate 2; and 4) performing bake hardening on the photoresist pattern.

In practice, a photoresist pattern may also be formed on one of the surfaces of the protective substrate 2 by means of screen printing in the present disclosure.

In practice, the inner support member, the outer support member and the blocking member in the embodiment of the present disclosure may not be limited to be made of the photoresist, and may be made of other materials. A material layer covering one of the surfaces of the protective substrate is formed firstly, and the material layer is patterned to remove a part of the material layer and form the support unit. In some embodiments, the material layer may be made of an insulating dielectric material such as silicon oxide, silicon nitride, silicon oxynitride, is formed by performing a deposition process, and subsequently the material layer is patterned using an etching process, to form the support unit.

In some other embodiments, the support unit may also be formed by etching the protective substrate. A patterned photoresist layer may be formed on the protective substrate, and the protective substrate is etched by taking the patterned photoresist layer as a mask, to form the support unit on the protective substrate.

The protective substrate 2 is laminated with the wafer 1 through an adhesive layer. The adhesive layer is formed on a top surface of the support unit on the protective substrate 2, and the protective substrate 1 is laminated with the wafer 1, to bond the protective substrate 2 and the wafer 1 together through the adhesive layer. The adhesive layer can not only achieve an adhesion effect, but also achieve an insulating and sealing effect. The adhesive layer may be made of a high-polymer adhesive material such as silica gel, epoxy resin, benzocyclobutene and other polymer materials.

After the protective substrate 2 is laminated with the wafer 1, the wafer 1 is packaged.

Referring to FIG. 3, firstly, the wafer 1 is thinned from the second surface 102 of the wafer 1, so as to facilitate the subsequent etching for the through hole 115. The wafer 1 may be thinned by a mechanical grinding process, a chemical mechanical grinding process, and the like. The wafer 1 is etched from the second surface 102 of the wafer 1 to form a through hole (not shown), and the contact pad 112 on one side of the first surface 101 of the wafer 1 is exposed through the through hole 115. An insulating layer 116 is formed on the second surface 102 of the wafer 1 and on sidewalls of the through hole, and the contact pad 112 at the bottom of the through hole is exposed through the insulating layer 116. The insulating layer 116 may provide electric insulation for the second surface 102 of the wafer 1. The insulating layer 116 may be made of silicon oxide, silicon nitride, silicon oxynitride or insulating resin. A wiring layer 113 connected with the contact pad 112 is formed on a surface of the insulating layer 116. As a rewiring layer, the wiring layer 113 may connect the contact pad 112 to the second surface 102 of the wafer 1, and then connect to an external circuit. The wiring layer 113 is formed by depositing a metal film and etching the metal film. Next, a solder mask 117 having an opening (not shown) is formed on the surface of the wiring layer 113 and a surface of the insulating layer 116, and a part of the surface of the wiring layer 113 is exposed through the opening. The solder mask 117 is made of an insulating dielectric material such as silicon oxide and silicon nitride, to protect the wiring layer 113. An external projection is formed on the surface of the solder mask 117, and the external projection fills the opening. In the embodiment, the external projection is a solder ball 114, which may be made of a metal material such as copper, aluminum, gold, tin or lead.

After the wafer 1 is packaged, the wafer 1 is cut into multiple finished semiconductor chips.

In the present disclosure, the first ventilating structure arranged on the inner support member and the second ventilating structure arranged on the outer support member are not limited to be the openings, and may be through holes. The height of the through hole is less than the height of the support unit, and the height of the opening is the same as the height of the support unit. The through hole may be formed by means of laser etching.

It should be understood that the specification is described according to the embodiments just for clarity, and each embodiment does not merely include one independent technical solution. Those skilled in the art should take the specification as a whole, in which technical solutions in the embodiments may be suitably combined to form other embodiments understandable for those skilled in the art.

The detailed description set forth above is merely for feasible embodiments of the present disclosure, and is not intended to limit the protection scope of the present disclosure. Any equivalent embodiments or variations made without departing from the technology and the spirit of the present disclosure should be included within the protection scope of the present disclosure.

The invention claimed is:

1. A semiconductor chip package, comprising:
   a semiconductor chip having a functional region;
   a protective substrate arranged on one side of the semiconductor chip and covering the functional region; and
   a support unit arranged between the protective substrate and the semiconductor chip, and enclosing the functional region,
   wherein the support unit comprises an outer support member and an inner support member arranged inside the outer support member, an accommodating cavity is formed among the inner support member, the semiconductor chip and the protective substrate, a hollow cavity is formed among the inner support member, the outer support member, the semiconductor chip and the protective substrate;
   wherein the inner support member is provided with at least one first ventilating structure, through which the accommodating cavity is in communication with the hollow cavity; and
   wherein the outer support member is provided with at least one second ventilating structure, through which the hollow cavity is in communication with outside of the outer support member, and the first ventilating structure and the second ventilating structure are staggered from each other.

2. The semiconductor chip package according to claim 1, wherein an airflow passage is formed in the hollow cavity, and a distance between the first ventilating structure and the second ventilating structure is no less than a half of a length of the airflow passage.

3. The semiconductor chip package according to claim 1, wherein the inner support member is provided with at least two first ventilating structures, and a line between the two first ventilating structures is located at an edge of the functional region.

4. The semiconductor chip package according to claim 1, wherein
the first ventilating structure is an opening or a through hole, and
a height of the opening is equal to a height of the inner support member, and a height of the through hole is less than the height of the inner support member.

5. The semiconductor chip package according to claim 1, wherein
the second ventilating structure is an opening or a through hole, and
a height of the opening is equal to a height of the inner support member, and a height of the through hole is less than the height of the inner support member.

6. The semiconductor chip package according to claim 1, wherein the semiconductor chip is an image sensor chip.

7. The semiconductor chip package according to claim 1, wherein the semiconductor chip has a first surface and a second surface opposite to the first surface, and the semiconductor chip comprises:
contact pads electrically connected to the functional region;
through holes penetrating the semiconductor chip from the second surface of the semiconductor chip, wherein the contact pads are exposed through the through holes;
an insulating layer covering the second surface of the semiconductor chip and sidewall surfaces of the through holes;
a metal layer arranged on a surface of the insulating layer and electrically connected to the contact pads;
a solder mask arranged on a surface of the metal layer and the surface of the insulating layer, wherein the solder mask comprises openings through which a part of the metal layer is exposed; and
external projections filling the openings and exposed outside a surface of the solder mask.

8. The semiconductor chip package according to claim 1, wherein the hollow cavity is provided with a blocking member for blocking airflow, and the first ventilating structure and the second ventilating structure are arranged at two sides of the blocking member respectively.

9. The semiconductor chip package according to claim 8, wherein the inner support member, the outer support member and the blocking member are made of photoresist.

10. A packaging method for the semiconductor chip package according to claim 1, comprising:
providing a wafer to be packaged, wherein a plurality of semiconductor chips is arranged in an array on the wafer, and each of the plurality of semiconductor chips has a functional region;
providing a protective substrate, and forming a plurality of support units arranged in an array on the protective substrate, wherein each of the plurality of support units corresponds to one of the semiconductor chips;
aligning and laminating the protective substrate with the wafer, to bond the protective substrate and the wafer together, wherein the support units are arranged between the protective substrate and the wafer, wherein each of the support units comprises an outer support member and an inner support member arranged inside the outer support member, an accommodating cavity is formed among the inner support member, the semiconductor chip and the protective substrate, a hollow cavity is formed among the inner support member, the outer support member, the semiconductor chip and the protective substrate, and the inner support member is provided with at least one first ventilating structure, through which the accommodating cavity is in communication with the hollow cavity, and
wherein the outer support member is provided with at least one second ventilating structure, through which the hollow cavity is in communication with outside of the outer support member; and the first ventilating structure and the second ventilating structure are staggered from each other.

11. The packaging method according to claim 10, wherein the forming the support units on the protective substrate comprises:
forming a photoresist film on a surface of the protective substrate;
performing pattern exposure on the photoresist film by using a patterned mask;
developing to form photoresist patterns on the protective substrate; and
performing bake hardening on the photoresist patterns to form the support units.

12. The packaging method according to claim 10, wherein the forming the support units on the protective substrate comprises:
forming photoresist patterns on a surface of the protective substrate by screen printing;
exposing and developing the photoresist patterns; and
performing bake hardening on the photoresist patterns to form the support units.

13. The packaging method according to claim 10, wherein the forming the support units on the protective substrate comprises:
forming a material layer on a surface of the protective substrate; and
patterning the material layer to remove a part of the material layer and form the support units.

14. A semiconductor chip package, comprising:
a semiconductor chip having a functional region;
a protective substrate arranged on one side of the semiconductor chip and covering the functional region; and
a support unit arranged between the protective substrate and the semiconductor chip, and enclosing the functional region,
wherein the support unit comprises an outer support member and an inner support member arranged inside the outer support member, an accommodating cavity is formed among the inner support member, the semiconductor chip and the protective substrate, a hollow cavity is formed among the inner support member, the outer support member, the semiconductor chip and the protective substrate; and
wherein the inner support member is provided with two first ventilating structures, through which the accommodating cavity is in communication with the hollow cavity, the two first ventilating structures are arranged at two opposite sides of the inner support member, and a line connecting the two first ventilating structures does not cross the functional region that is located within the inner support member.

15. The semiconductor chip package according to claim 14, wherein:
the first ventilating structure is an opening or a through hole, and
a height of the opening is equal to a height of the inner support member, and a height of the through hole is less than the height of the inner support member.

16. The semiconductor chip package according to claim 14, wherein the semiconductor chip is an image sensor chip.

17. The semiconductor chip package according to claim 14, wherein the semiconductor chip has a first surface and a second surface opposite to the first surface, and the semiconductor chip comprises:
contact pads electrically connected to the functional region;
through holes penetrating the semiconductor chip from the second surface of the semiconductor chip, wherein the contact pads are exposed through the through holes;
an insulating layer covering the second surface of the semiconductor chip and sidewall surfaces of the through holes;
a metal layer arranged on a surface of the insulating layer and electrically connected to the contact pads;
a solder mask arranged on a surface of the metal layer and the surface of the insulating layer, wherein the solder mask comprises openings through which a part of the metal layer is exposed; and
external projections filling the openings and exposed outside a surface of the solder mask.

18. A packaging method for the semiconductor chip package according to claim 14, comprising:
providing a wafer to be packaged, wherein a plurality of semiconductor chips is arranged in an array on the wafer, and each of the plurality of semiconductor chips has a functional region;
providing a protective substrate, and forming a plurality of support units arranged in an array on the protective substrate, wherein each of plurality of support units corresponds to one of the semiconductor chips; and
aligning and laminating the protective substrate with the wafer, to bond the protective substrate and the wafer together, wherein the support units are arranged between the protective substrate and the wafer, wherein:
each of the support units comprises an outer support member and an inner support member arranged inside the outer support member;
an accommodating cavity is formed among the inner support member, the semiconductor chip and the protective substrate;
a hollow cavity is formed among the inner support member, the outer support member, the semiconductor chip and the protective substrate;
the inner support member is provided with two first ventilating structures, through which the accommodating cavity is in communication with the hollow cavity;
the two first ventilating structures are arranged at two opposite sides of the inner support member; and
a line connecting the two first ventilating structures does not cross the functional region that is located within the inner support member.

* * * * *